US012471436B2

United States Patent
Wan

(10) Patent No.: US 12,471,436 B2
(45) Date of Patent: Nov. 11, 2025

(54) OLED DISPLAY PANEL AND OLED DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Zhijun Wan, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/755,872

(22) PCT Filed: Apr. 22, 2022

(86) PCT No.: PCT/CN2022/088403
§ 371 (c)(1),
(2) Date: May 10, 2022

(87) PCT Pub. No.: WO2023/197353
PCT Pub. Date: Oct. 19, 2023

(65) Prior Publication Data
US 2024/0155862 A1    May 9, 2024

(30) Foreign Application Priority Data
Apr. 11, 2022   (CN) .................. 202210374905.X

(51) Int. Cl.
*H10K 50/165*   (2023.01)
*H10K 50/16*    (2023.01)
(Continued)

(52) U.S. Cl.
CPC .......... *H10K 50/165* (2023.02); *H10K 50/16* (2023.02); *H10K 50/171* (2023.02);
(Continued)

(58) Field of Classification Search
CPC .... H10K 50/16; H10K 50/165; H10K 50/171; H10K 50/82–828; H10K 50/88;
(Continued)

(56) References Cited

U.S. PATENT DOCUMENTS

2003/0146693 A1* 8/2003 Ishihara ............... H10K 59/131
                                                313/504
2013/0328024 A1* 12/2013 Mizusaki ......... H10K 59/80516
                                                 438/46
(Continued)

FOREIGN PATENT DOCUMENTS

CN      101682957 A      3/2010
CN      106058067 A      10/2016
(Continued)

OTHER PUBLICATIONS

International Search Report in International application No. PCT/CN2022/088403, mailed on Dec. 22, 2022.
(Continued)

*Primary Examiner* — Zandra V Smith
*Assistant Examiner* — Molly K Reida
(74) *Attorney, Agent, or Firm* — PV IP PC; Wei Te Chung

(57) ABSTRACT

An organic light-emitting diode (OLED) display panel and an OLED display device are provided. In the OLED display panel, a thickness of an electronic layer is set to be less than a first default value, and/or a material mobility of at least one of the electronic layer or a common electrode layer is set to be greater than a second default value. The electronic layer and the common electrode layer can be formed by one metal
(Continued)

mask, so a manufacturing efficiency of the OLED display panel can be improved, and a cost can be reduced, and meanwhile, the common electrode layer and metal terminals can be normally conducted to each other, allowing the OLED display panel to work normally.

19 Claims, 6 Drawing Sheets

(51) Int. Cl.
| | | |
|---|---|---|
| *H10K 50/17* | (2023.01) | |
| *H10K 59/131* | (2023.01) | |
| *H10K 59/80* | (2023.01) | |
| *H10K 102/00* | (2023.01) | |
| *H10K 102/20* | (2023.01) | |

(52) U.S. Cl.
CPC ..... *H10K 59/131* (2023.02); *H10K 59/80522* (2023.02); *H10K 2102/20* (2023.02); *H10K 2102/351* (2023.02)

(58) Field of Classification Search
CPC ... H10L 59/131; H10L 59/8052–80524; H10L 59/88
See application file for complete search history.

(56) References Cited

U.S. PATENT DOCUMENTS

| | | | |
|---|---|---|---|
| 2015/0179726 A1* | 6/2015 | Liu | H10K 77/10 |
| | | | 257/40 |
| 2017/0005158 A1* | 1/2017 | Yeo | H10K 50/16 |
| 2021/0351371 A1* | 11/2021 | Wang | H10K 50/865 |

FOREIGN PATENT DOCUMENTS

| | | |
|---|---|---|
| CN | 108767130 A | 11/2018 |
| CN | 111224004 A | 6/2020 |
| CN | 111584564 A | 8/2020 |
| CN | 113409992 A | 9/2021 |

OTHER PUBLICATIONS

Written Opinion of the International Search Authority in International application No. PCT/CN2022/088403, mailed on Dec. 22, 2022.

Chinese Office Action issued in corresponding Chinese Patent Application No. 202210374905.X dated May 21, 2025, pp. 1-8.

* cited by examiner (a)

(b)

(c)

distance from an upper surface of the common electrode layer (a)

(b)

(a)

(b)

OLED DISPLAY PANEL AND OLED DISPLAY DEVICE

FIELD OF INVENTION

The present disclosure relates to the field of display technologies, and more particularly, to an OLED display panel and an OLED display device.

BACKGROUND OF INVENTION

With development of display technology, in order to reduce costs, inkjet printing is used to form hole injection layers, hole transport layers, and light-emitting layers in organic light-emitting diode (OLED) display devices. However, due to material limitations of electron transport layers and electron injection layers, the electron transport layers and the electron injection layers can only be formed by vapor deposition, and cathodes are also formed by vapor deposition during manufacturing processes. Since the cathodes need to be connected to metal wirings on transistors when they are formed, it is necessary to make a film-forming area of the cathodes larger than film-forming areas of the electron injection layers and the electron transport layers. This will result in a need for at least two masks, designing a plurality of cavities to form the cathodes and the electron injection layers/electron transport layers with different film-forming areas, causing a low fabrication efficiency of the OLED display devices.

Therefore, current OLED display devices have a technical problem of the low fabrication efficiency of the OLED display devices caused by different masks of the cathodes and the electron injection layers/electron transport layers.

Technical problem: the embodiments of the present disclosure provide an OLED display panel and an OLED display device to solve the technical problem of the low fabrication efficiency of the OLED display devices caused by different masks of the cathodes and the electron injection layers/electron transport layers in current OLED display devices.

SUMMARY OF INVENTION

To solve the above problems, an embodiment of the present disclosure provides following technical solutions.

An embodiment of the present disclosure provides an OLED display panel, which includes:
  a substrate;
  a driving circuit layer disposed on one side of the substrate and including a metal terminal;
  a light-emitting functional layer disposed on one side of the driving circuit layer away from the substrate and including an electronic layer and a common electrode layer; and
  an encapsulation layer disposed on one side of the light-emitting functional layer away from the driving circuit layer;
  wherein, the OLED display panel includes a display area and an overlapping area, and in the overlapping area, the electronic layer is disposed between the common electrode layer and the metal terminal; and a thickness of the electronic layer is less than a first default value, and/or a material mobility of at least one of the electronic layer or the common electrode layer is greater than a second default value, the first default value is a thickness that a particle tunneling effect occurs, and the second default value is a particle mobility when the common electrode layer and the metal terminal are conducted.

In some embodiments, the thickness of the electronic layer is less than 10 nm.

In some embodiments, a material of the common electrode layer includes a metal material, and a mobility of the metal material is greater than the second default value.

In some embodiments, the common electrode layer includes a plurality of film layers disposed in a stack, a material of at least one of the film layers includes a metal material, and a mobility of the metal material is greater than the second default value.

In some embodiments, the electronic layer includes an electron injection layer and an electron transport layer, the electron injection layer is disposed between the electron transport layer and the common electrode layer, and a material mobility of at least one of the electron injection layer or the electron transport layer is greater than the second default value.

In some embodiments, a material of the electron injection layer includes an organic material, a material of the electron transport layer includes another organic material, at least one of the electron injection layer or the electron transport layer is doped with a first conductive material, and a mobility of the first conductive material is greater than the second default value.

In some embodiments, a material of the electron injection layer includes a second conductive material, a material of the electron transport layer includes an organic material, and a mobility of the second conductive material is greater than the second default value.

In some embodiments, the electron transport layer is doped with a third conductive material, and a sum of a mobility of the third conductive material and the mobility of the second conductive material is greater than the second default value.

In some embodiments, a material of the electron injection layer includes a second conductive material, a material of the electron transport layer includes an organic material, the electron transport layer is doped with a third conductive material, a mobility of the second conductive material is less than or equal to the second default value, and a sum of a mobility of the second conductive material and a mobility of the third conductive material is greater than the second default value.

Further, an embodiment of the present disclosure provides an OLED display device, which includes an OLED display panel and a driving chip, wherein, the OLED display panel includes:
  a substrate;
  a driving circuit layer disposed on one side of the substrate and including a metal terminal;
  a light-emitting functional layer disposed on one side of the driving circuit layer away from the substrate and including an electronic layer and a common electrode layer; and
  an encapsulation layer disposed on one side of the light-emitting functional layer away from the driving circuit layer;
  wherein, the OLED display panel includes a display area and an overlapping area, and in the overlapping area, the electronic layer is disposed between the common electrode layer and the metal terminal; and a thickness of the electronic layer is less than a first default value, and/or a material mobility of at least one of the electronic layer or the common electrode layer is greater than a second default value, the first default value is a thickness that a particle tunneling effect occurs, and the second default value is a particle mobility when the common electrode layer and the metal terminal are conducted.

In some embodiments, the thickness of the electronic layer is less than 10 nm.

In some embodiments, a material of the common electrode layer includes a metal material, and a mobility of the metal material is greater than the second default value.

In some embodiments, the common electrode layer is a single metal layer.

In some embodiments, the common electrode layer includes a plurality of film layers disposed in a stack, a material of at least one of the film layers includes a metal material, and a mobility of the metal material is greater than the second default value.

In some embodiments, the common electrode layer includes a plurality of film layers disposed in a stack, a material of at least one of the film layers includes a metal material, and a mobility of the metal material is greater than the second default value.

In some embodiments, the electronic layer includes an electron injection layer and an electron transport layer, the electron injection layer is disposed between the electron transport layer and the common electrode layer, and a material mobility of at least one of the electron injection layer or the electron transport layer is greater than the second default value.

In some embodiments, a material of the electron injection layer includes an organic material, a material of the electron transport layer includes another organic material, at least one of the electron injection layer or the electron transport layer is doped with a first conductive material, and a mobility of the first conductive material is greater than the second default value.

In some embodiments, a material of the electron injection layer includes a second conductive material, a material of the electron transport layer includes an organic material, and a mobility of the second conductive material is greater than the second default value.

In some embodiments, the electron transport layer is doped with a third conductive material, and a sum of a mobility of the third conductive material and the mobility of the second conductive material is greater than the second default value.

In some embodiments, a material of the electron injection layer includes a second conductive material, a material of the electron transport layer includes an organic material, the electron transport layer is doped with a third conductive material, a mobility of the second conductive material is less than or equal to the second default value, and a sum of a mobility of the second conductive material and a mobility of the third conductive material is greater than the second default value.

Beneficial Effect

The present disclosure provides the OLED display panel and the OLED display device. The OLED display panel includes the substrate, the driving circuit layer, the light-emitting functional layer, and the encapsulation layer. The driving circuit layer is disposed on one side of the substrate and includes the metal terminal. The light-emitting functional layer is disposed on one side of the driving circuit layer away from the substrate and includes the electronic layer and the common electrode layer. The encapsulation layer is disposed on one side of the light-emitting functional layer away from the driving circuit layer. Wherein, the OLED display panel includes the display area and the overlapping area, and in the overlapping area, the electronic layer is disposed between the common electrode layer and the metal terminal. The thickness of the electronic layer is less than the first default value, and/or the material mobility of at least one of the electronic layer or the common electrode layer is greater than the second default value, the first default value is the thickness that the particle tunneling effect occurs, and the second default value is the particle mobility when the common electrode layer and the metal terminal are conducted. In the present disclosure, by allowing the thickness of the electronic layer to be less than the first default value and/or the material mobility of at least one of the electronic layer or the common electrode layer to be greater than the second default value, when the current is input, the metal terminal and the common electrode layer are connected and conducted to each other by the particle tunneling effect, or by particle migration when speeding up the particle migration during panels are tested. Therefore, the electronic layer and the common electrode layer may be formed by one metal mask, so a manufacturing efficiency of the OLED display panel can be improved and a cost can be reduced, and meanwhile, the common electrode layer and the metal terminal can be normally connected and conducted to each other, allowing the OLED display panel to work normally.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In view of technical problems of a low fabrication efficiency of OLED display devices caused by different masks of cathodes and electron injection layers/electron transport layers existed in current OLED display devices, the embodiments of the present disclosure provide an OLED display panel and an OLED display device to solve the above technical problems.

Figure 1:
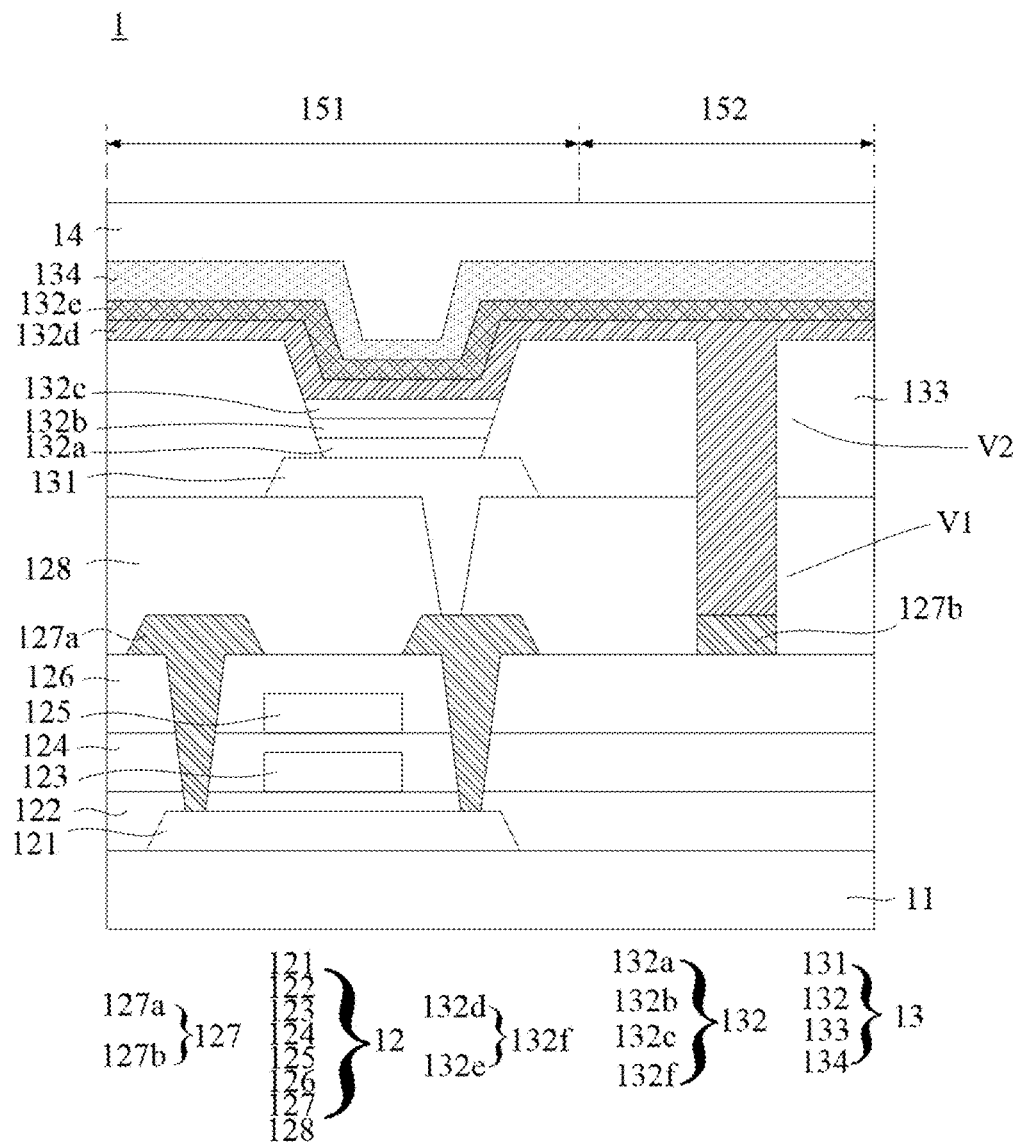
FIG. 1 is a schematic diagram of an OLED display panel according to an embodiment of the present disclosure.

As shown in FIG. 1, an embodiment of the present disclosure provides an OLED display panel 1, which includes:

a substrate 11;

a driving circuit layer 12 disposed on one side of the substrate 11 and including a metal terminal 127b;

a light-emitting functional layer 13 disposed on one side of the driving circuit layer 12 away from the substrate 11 and including an electronic layer 132f and a common electrode layer 134; and an encapsulation layer 14 disposed on one side of the light-emitting functional layer 13 away from the driving circuit layer 12.

Wherein, the OLED display panel 1 includes a display area 151 and an overlapping area 152, and in the overlapping area 152, the electronic layer 132f is disposed between the common electrode layer 134 and the metal terminal 127b. A thickness of the electronic layer 132f is less than a first default value, and/or a material mobility of at least one of the electronic layer 132f or the common electrode layer 134 is greater than a second default value. The first default value is a thickness that a particle tunneling effect occurs, and the second default value is a particle mobility when the common electrode layer 134 and the metal terminal 127b are connected and conducted to each other.

This embodiment of the present disclosure provides the OLED display panel. In the OLED display panel, the thickness of the electronic layer is set to be less than the first default value, and/or the material mobility of at least one of the electronic layer or the common electrode layer is set to be greater than the second default value. When a current is input, the metal terminal and the common electrode layer are connected and conducted to each other by the particle tunneling effect, or by particle migration when speeding up the particle migration during panels are tested. Therefore, the electronic layer and the common electrode layer may be formed by one metal mask, so a manufacturing efficiency of the OLED display panel can be improved and a cost can be reduced, and meanwhile, the common electrode layer and the metal terminal can be normally connected and conducted to each other, allowing the OLED display panel to work normally.

It should be noted that the first default value refers to that during processes of manufacturing the OLED display panel, no additional processing is required for the OLED display panel, a material of the electronic layer may be an organic material, and at this time, when the thickness of the electronic layer is less than the first default value, the tunneling effect of particles may occur, thereby connecting and conducting the metal terminal and the common electrode layer. For example, when the thickness of the electronic layer is less than 10 nm, even if the electronic layer uses the organic material, since electrons can pass through the electronic layer to form a stable current between the metal terminal and the common electrode layer, the first default value may be 10 nm.

It should be noted that when the thicknesses of the electronic layer and the common electrode layer are not specially designed and only a material of at least one of the electronic layer or the common electrode layer is designed to allow the material mobility to be greater than the second default value, the second default value refers to a mobility that allows the metal terminal and the common electrode layer to be normally conducted to each other if the current is input into the OLED display panel. Specifically, for example, when the mobility of at least one of the electronic layer or the common electrode layer is greater than 10 to the 6th power, the common electrode layer and the metal terminal can be conducted to each other normally, and the second default value may be a value of 10 to the 6th power.

It should be noted that since there is a process of high-temperature aging or power-on aging in the manufacturing processes of OLED display panels, this process will speed up a velocity of the particle migration. Even if the OLED display panels are manufactured without the process of high-temperature aging or power-on aging, a lighting test will also be performed, which also speeds up the velocity of the particle migration. The present disclosure refers to characteristics of each film layer in prepared OLED display panels, and therefore, the mobilities of the electronic layer and the common electrode layer are determined based on this.

In view of the problems of the low manufacturing efficiency and the high cost caused by the electronic layer being unable to conduct metal wirings and the cathode, and multiple masks being required to form the electronic layer and the common electrode layer, respectively, in an embodiment, the thickness of the electronic layer is less than 10 nm. By setting the thickness of the electronic layer to be less than 10 nm, when the electronic layer is an insulating material, since the tunneling effect of the electrons, the metal terminal and the common electrode layer can still be conducted to each other when the OLED display panel displays. Therefore, the electronic layer and the common electrode layer may be formed by a same mask, which can prevent using the multiple masks to form the electronic layer and the common electrode layer, respectively, and resulting in the high cost, thereby improving the manufacturing efficiency of the OLED display panel.

Specifically, the electronic layer includes an electron transport layer, and a thickness of the electron transport layer is less than 10 nm. When the electronic layer includes the electron transport layer, the thickness of the electron transport layer can be set to be less than 10 nm, so that when the electron transport layer is an insulating material, since the tunneling effect of the electrons, the metal terminal and the common electrode layer can still be conducted to each other when the OLED display panel displays. Therefore, the electronic layer and the common electrode layer may be formed by the same mask, which can prevent using the multiple masks to form the electronic layer and the common electrode layer, respectively, and resulting in the high cost, thereby improving the manufacturing efficiency of the OLED display panel.

Specifically, the electronic layer includes the electron transport layer and an electron injection layer, and a sum of the thickness of the electron transport layer and a thickness of the electron injection layer is less than 10 nm. When the electronic layer includes the electron transport layer and the electron injection layer, the sum of the thickness of the electron transport layer and the thickness of the electron injection layer is set to be less than 10 nm, so that when the electron transport layer and the electron injection layer are the insulating material, since the tunneling effect of the electrons, the metal terminal and the common electrode layer can still be conducted to each other when the OLED display panel displays. Therefore, the electronic layer and the common electrode layer may be formed by the same mask, which can prevent using the multiple masks to form the electronic layer and the common electrode layer, respectively, and resulting in the high cost, thereby improving the manufacturing efficiency of the OLED display panel.

Figure 2:
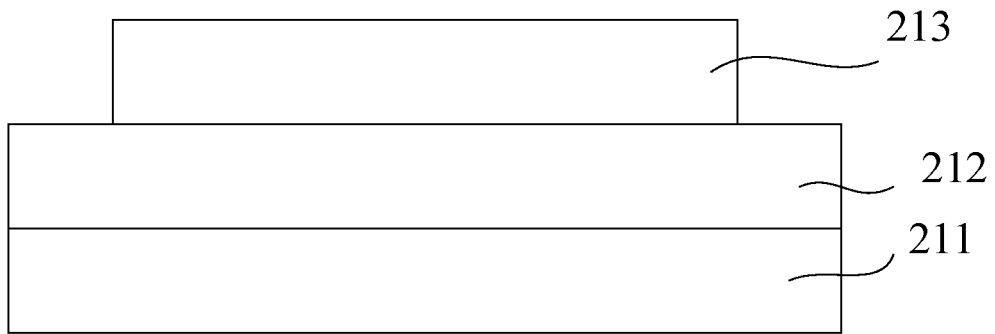
FIG. 2 is a comparison diagram of an analog structure of an existing OLED display panel and an analog structure of the OLED display panel of the present disclosure according to an embodiment of the present disclosure.
Figure 2:
Figure 2:
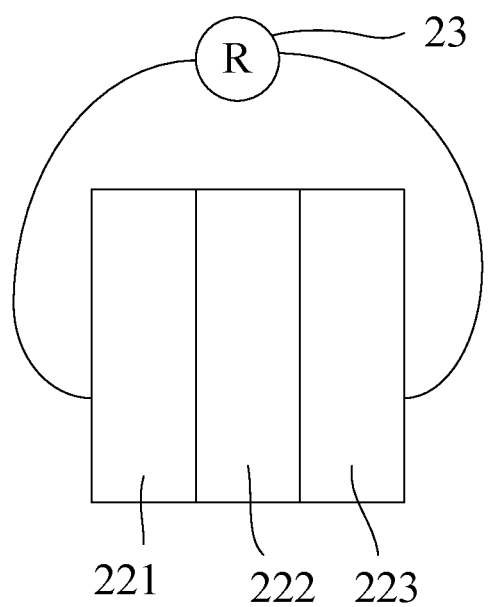

Specifically, as shown in FIG. 2, analog structures in overlapping areas of the current OLED display panel and the OLED display panel of the present disclosure are taken as an example, and resistances in the overlapping areas of the current OLED display panel and the OLED display panel of the present disclosure are tested. As shown in FIG. 2 (a), the current OLED display panel uses two masks to form the electronic layer and the cathode, respectively, the analog structure thereof includes a substrate 211, a metal wiring 212, and a cathode 213, and the overlapping area is not provided with the electronic layer. As shown in FIG. 2 (b), the OLED display panel of the present disclosure uses one mask to form the electronic layer and the cathode, and the analog structure thereof includes the substrate 211, the metal wiring 212, an electronic layer 214, and the cathode 213. A testing method shown in FIG. 2 (c) is taken as an example. The analog structure 222 is disposed between a first metal plate 221 and a second metal plate 223, and a resistance of the analog structure 222 is detected with a multimeter 23, obtaining a following table.

TABLE 1 a resistance comparison table of different analog structures.

| | number of experiments | | | |
|---|---|---|---|---|
| | first experiment | | second experiment | |
| | number of structures | | | |
| | A | B | A | B |
| number of samples | 2 | 2 | 2 | 2 |
| resistance of different samples | 70.2 ohms; 72.6 ohms | 69.7 ohms; 73.4 ohms | 128.4 ohms; 140 ohms | 128.1 ohms; 153.1 ohms |

From data of table 1, it can be known that the metal wiring 212 and the cathode 213 in FIG. 2(a) are taken as the analog structure A, and the metal wiring 212, the electronic layer 214, and the cathode 213 in FIG. 2(b) are taken as the analog structure B. Wherein, the material of the electronic layer is sodium fluoride, and experiments on each structure are performed to get resistance values of different samples. The variables of the first experiment and the second experiment are thicknesses of the cathode and the metal wiring, and the variables of the structures A and B are different structures.

From the data of table 1, it can be seen that in the first experiment and the second experiment, the resistances of the structures A and B are basically same. For example, in the first experiment, the resistances of the structures A and B are about 70 ohms, and the resistance of the structure B is even less than the resistance of the structure A (69.7 ohms is less than 70.2 ohms). In the second experiment, the resistances of the structures A and B are about 140 ohms, and a difference between the resistance values of the two structures is less. Therefore, it can proved that when the thickness of the electronic layer is less than 10 nm, the common electrode layer and the metal terminal of the OLED display panel can be conducted to each other normally.

In view of the problems of the low manufacturing efficiency and the high cost caused by the electronic layer being unable to conduct metal wirings and the cathode, and multiple masks being required to form the electronic layer and the common electrode layer, respectively, in an embodiment, a material of the common electrode layer includes a metal material, and a mobility of the metal material is greater than the second default value. Forming the common electrode layer by the metal material allows the metal material to migrate. In addition, there is the process of high-temperature aging or power-on aging in the manufacturing processes of the OLED display panels, thereby speeding up a migration velocity of the metal material, and the lighting test will also be performed in the manufacturing processes of the OLED display panels, so that under the effect of electric field, metal particles can migrate to the electronic layer, thereby improving conductivity of the electronic layer. Therefore, when the electronic layer and the common electrode layer are formed by the same mask, the common electrode layer and the metal terminal can be conducted to each other normally, the manufacturing efficiency of the OLED display panel can be improved, and the manufacturing cost of the OLED display panel can be reduced.

In an embodiment, the common electrode layer is a single metal layer. The common electrode layer formed by the single metal layer can allow the conductivity of the common electrode layer to be better and a migration effect of the particles to be better.

In an embodiment, the common electrode layer includes a plurality of film layers disposed in a stack, a material of at least one of the film layers includes the metal material, and a mobility of the metal material is greater than the second default value. By setting the common electrode layer to include the plurality of film layers disposed in the stack and at least one of the film layers to be the metal material, particles in the metal material can connect and conduct the common electrode layer and the metal terminal by migration. For other film layers in the common electrode layer, a light transmittance of the other film layers may be set better, thereby preventing the light transmittance of the common electrode layer from being poor and causing the light transmittance of the OLED display panel to be low, thereby causing higher power consumption of the OLED display panel.

Specifically, the metal material includes silver or silver alloy. Since a mobility of silver is high, using silver as the material of the common electrode layer can improve the migration effect, and the conductivity of the electronic layer can be improved by the migration of silver particles, thereby conducting the common electrode layer and the metal terminal. In addition, since the manufacturing processes of the OLED display panels at least include the lighting test, the migration of silver particles can speed up by the lighting test, thereby improving the conductivity between the metal terminal and the common electrode layer.

Specifically, the OLED display panel includes a top emission OLED display panel and a bottom emission OLED display panel. The top emission OLED display panel using silver as the common electrode layer will have a problem of low transmittance. Therefore, in the embodiments of the present disclosure, when using silver or silver alloy as the common electrode layer of the top emission OLED display panel, the thickness of the common electrode layer can be set less. For example, the thickness of the common electrode layer may range from 10 nm to 30 nm, thereby ensuring the transmittance of the top emission OLED display panel, or the transmittance of the top emission OLED display panel can be improved by setting the common electrode layer as the stack and using materials having better light transmittance to form a portion of film layers. For the bottom emission OLED display panel, the common electrode layer may be make thicker to improve reflectivity.

Regarding the problems of the low manufacturing efficiency and the high cost caused by the electronic layer being an organic material and unable to conduct the metal wirings and the cathode, and multiple masks being required to form the electronic layer and the common electrode layer, respectively, solutions are as follows. In an embodiment, as shown in FIG. 1, the electronic layer 132 includes an electron injection layer 132*e* and an electron transport layer 132*d*, the electron injection layer 132*e* is disposed between the electron transport layer 132*d* and the common electrode layer 134, and a material mobility of at least one of the electron injection layer 132*e* or the electron transport layer 132*d* is greater than the second default value. By setting the material mobility of at least one of the electron injection layer 132*e* or the electron transport layer 132*d* to be greater than the second default value, particles of materials in the electron injection layer 132*e* and the electron transport layer 132*d* can migrate, thereby realizing conduction of the electron injection layer 132*e* and the electron transport layer 132*d*. Therefore, the conductivity of the electron injection layer 132*e* and the electron transport layer 132*d* is improved, and the electron injection layer 132*e* and the electron transport layer 132*d* can conduct the metal terminal and the common electrode layer.

In an embodiment, a material of the electron injection layer 132*e* includes an organic material, a material of the electron transport layer 132*d* includes another organic material, at least one of the electron injection layer 132*e* or the electron transport layer 132*d* is doped with a first conductive material, and a mobility of the first conductive material is greater than the second default value. By doping the first conductive material into at least one of the electron injection layer 132*e* or the electron transport layer 132*d* and setting the mobility of the first conductive material to be greater than the second default value, the conductivity of the electron injection layer 132*e* and the electron transport layer 132*d* is improved, and the electron injection layer 132*e* and the electron transport layer 132*d* can conduct the metal terminal and the common electrode layer.

Specifically, the first conductive material may be doped into the electron injection layer, or the electron transport layer, or the electron injection layer and the electron transport layer.

Specifically, when the first conductive material is doped into at least one of the electron injection layer or the electron transport layer, before the OLED display panel is powered, particles of the first conductive material will be distributed uniformly in the organic materials of the electron injection layer and the electron transport layer. After the OLED display panel is powered, the particles of the first conductive material will be connected to each other between the metal terminal and the common electrode layer to form metal paths, which are similar to microscopic metal filaments, thereby conducting the metal terminal and the common electrode layer.

Specifically, since the manufacturing processes of the OLED display panels include the lighting test and may also have the process of power-on aging or high-temperature aging, these processes will further speed up the migration of the first conductive material, thereby improving the conductivity of the electron injection layer and the electron transport layer.

Regarding a problem of the conductivity of the electron injection layer and the electron transport layer being still poor after doping conductive materials in the electron injection layer and the electron transport layer, solutions are as follows. In an embodiment, the material of the electron injection layer includes a second conductive material, the material of the electron transport layer includes the organic material, and a mobility of the second conductive material is greater than the second default value. Using the second conductive material to form the electron injection layer allows the electron injection layer to be directly conductive, and the second conductive material in the electron injection layer can migrate, which allows the electron transport layer to be conductive, thereby allowing the electronic layer to conduct the metal terminal and the common electrode layer. Since the electron injection layer is formed directly using the second conductive material, the conductivity of the electron injection layer is better, thereby improving the conductivity of the electron injection layer and the electron transport layer.

Specifically, since the manufacturing processes of the OLED display panels include the lighting test and may also have the process of power-on aging or high-temperature aging, these processes will further speed up the migration of the second conductive material, thereby improving the conductivity of the electron injection layer and the electron transport layer.

Regarding a problem of poorer conductivity of the electron transport layer formed using the organic material, solutions are as follows. In an embodiment, the electron transport layer is doped with a third conductive material, and a sum of a mobility of the third conductive material and the mobility of the second conductive material is greater than the second default value. The conductivity of the electron transport layer is improved by doping the third conductive material in the electron transport layer. In addition, the conductivity of the electron injection layer and the electron transport layer can be further improved by the migration of the second conductive material and the third conductive material, thereby allowing the electron injection layer and the electron transport layer to conduct the metal terminal and the common electrode layer.

Specifically, since the manufacturing processes of the OLED display panels include the lighting test and may also have the process of power-on aging or high-temperature aging, these processes will further speed up the migration of the third conductive material, thereby improving the conductivity of the electron injection layer and the electron transport layer.

In an embodiment, the material of the electron injection layer includes the second conductive material, the material of the electron transport layer includes the organic material, the electron transport layer is doped with the third conductive material, the mobility of the second conductive material is less than or equal to the second default value, and the sum of the mobility of the second conductive material and the mobility of the third conductive material is greater than the second default value. When selecting the second conductive material and the third conductive material, the sum of the mobility of the second conductive material and the mobility of the third conductive material may be set to be greater than the second default value to improve the conductivity of the electron injection layer and the electron transport layer by the migration of the second conductive material and the third conductive material, thereby conducting the metal terminal and the common electrode layer.

It should be noted that the first conductive material, the second conductive material, and the third conductive material in the above embodiments may be same or different. For example, the first conductive material is silver, and the second conductive material includes lithium or ytterbium. Materials of the first conductive material, the second conductive material, and the third conductive material are selected based on achieving their respective functions and having greater mobility.

It should be noted that in the above embodiments, the electron injection layer being the organic material, the electron transport layer being the organic material, and the common electrode layer being the metal material; the electron injection layer being the conductive material and the electron transport layer being the organic material; and the electron injection layer and the electron transport layer being the organic materials and doped with the conductive materials, are taken as examples for detailed description, respectively. Since some of features in the above-mentioned embodiments do not conflict, the embodiments of the present disclosure may use multiple features as one embodiment, and the embodiments of the present disclosure are not limited to the above-mentioned embodiments. When the features do not conflict, a combination of multiple features may be used as one embodiment, thereby further improving the conductivity between the common electrode layer and the metal terminal.

It should be noted that in the embodiments of the present disclosure, the particles include particles that can migrate, such as molecules, electrons, and ions.

Figure 3:
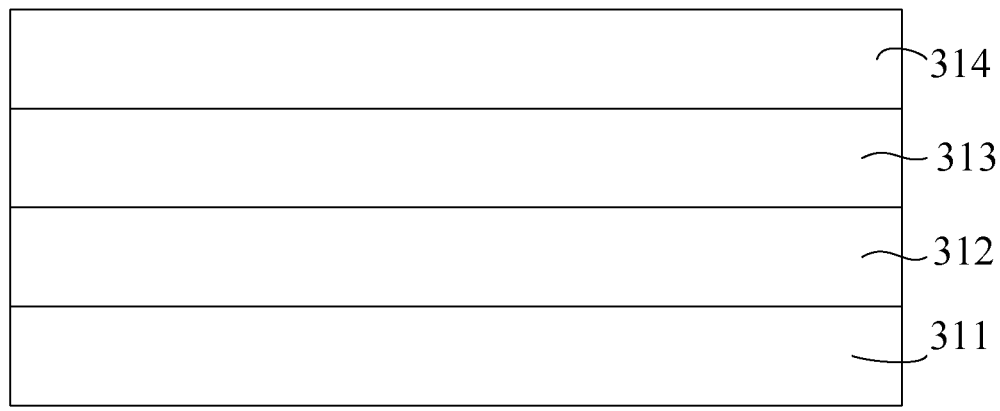
FIG. 3 is a schematic diagram of the analog structure of the OLED display panel according to an embodiment of the present disclosure.
Figure 4:
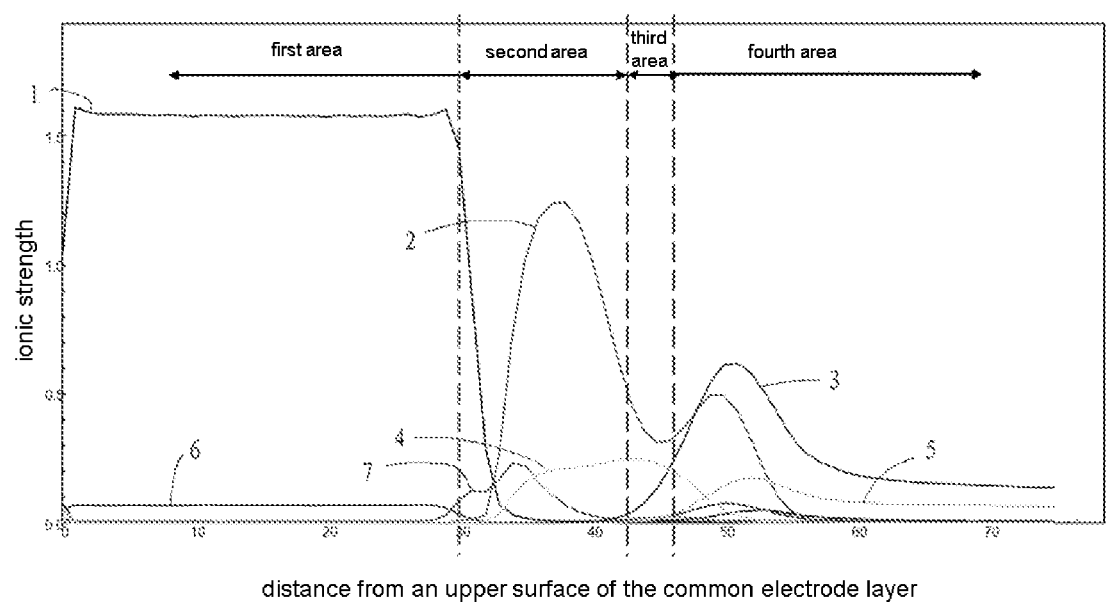
FIG. 4 is a graph showing an ionic strength of each element in the analog structure of FIG. 3.

As shown in FIG. 3, the analog structure of the OLED display panel including a molybdenum-titanium stacked metal terminal 311, a sodium fluoride layer 312, an electron transport layer 313 doped with metal (the doped metal is ytterbium), and a common electrode layer 314 containing silver is taken as an example. The analog structure was analyzed by time-of-flight secondary ion mass spectrometry to obtain the data shown in FIG. 4. In FIG. 4, the abscissa is a distance from an upper surface of the common electrode layer, and the ordinate is an ionic strength. Since in the present disclosure, only ratios of each ion are compared, specific units are not shown. A first area represents a range from a left side to a dotted line and corresponds to a range of the common electrode layer. A second area represents a range from the dotted line on the left to another dotted line on the right and corresponds to a range of the electron transport layer doped with metal. A third area represents a range from the dotted line on the left to the other dotted line on the right and corresponds to a range of the sodium fluoride layer. A fourth area represents a range from the dotted line on the left to the right and corresponds to the molybdenum-titanium stacked metal terminal.

Wherein, a first curve is an ionic strength curve of indium ions, a second curve is an ionic strength curve of ytterbium particles, a third curve is an ionic strength curve of titanium ions, a fourth curve is an ionic strength curve of carbon ions, a fifth curve is an ionic strength curve of molybdenum ions, a sixth curve is an ionic strength curve of zinc ions, and a seventh curve is an ionic strength curve of silver ions. An ionic strength curve of fluoride ions is not shown in FIG. 4 due to a low content thereof, which overlaps with other curves. From FIG. 4, it can be seen that in the second area, that is, in the range of the electron transport layer doped with metal, the ionic strength of silver ions is higher than other areas, which indicates that the silver ions migrate mainly to the electron transport layer doped with metal, thereby proving that silver can migrate to the electronic layer to improve the conductivity of the electronic layer.

Meanwhile, the analog structure shown in FIG. 2(a) and the analog structure shown in FIG. 3 are tested and compared. The testing method shown in FIG. 2 (c) is taken as an example. The two analog structures are tested, obtaining a following table.

TABLE 2 a resistance comparison table of different analog structures.

| | number of experiments first experiment | |
|---|---|---|
| number of structures | A | C |
| number of samples | 2 | 2 |
| resistance of different samples | 128.4 ohms; 140 ohms | 207.5 ohms; 215.8 ohms |

Wherein, in the analog structure of FIG. 3, a thickness of the sodium fluoride layer is less than 10 nm, and a thickness of the electron transport layer 313 doped with metal (the doped metal is ytterbium) is greater than 10 nm. The metal wiring 212 and the cathode 213 in FIG. 2(a) are taken as the analog structure A, and the analog structure in FIG. 3 is taken as an analog structure C. Experiments on each structure are performed to get resistance values of different samples. The variables of the structures A and C are different structures.

From the data in table 2, it can be seen that a resistance of the structure A is about 135 ohms, a resistance of the structure C is about 210 ohms. That is, when the structure shown in FIG. 3 is used, compared to using two masks to form the electronic layer and the common electrode layer of the OLED display panel, in the present disclosure, using one mask to form the electronic layer and the common electrode layer of the OLED display panel will cause the resistance to rise, but from the magnitude of the resistance rise, it can be seen that this magnitude will not cause the common electrode layer and the metal terminal to fail to conduct. Therefore, when the structures mentioned in the embodiments of the present disclosure are used, the common electrode layer and the metal terminal can still be conducted.

In addition, from the above experiments, it can be known that when the conductive material is further used as the electron injection layer, and metal is further doped in the electron transport layer, the conductivity between the common electrode layer and the metal terminal can be further improved.

Figure 5:
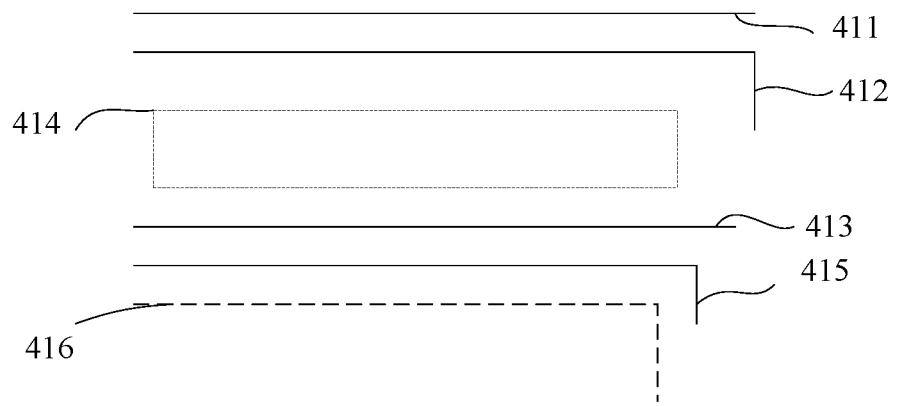
FIG. 5 is a schematic comparison diagram of a mask design of the OLED display panel and a mask design of the existing OLED display panel according to an embodiment of the present disclosure.
Figure 5:

As shown in FIG. 5, FIG. 5 (a) is a mask design of the current OLED display panels. From FIG. 5 (a), it can be seen that since the electron injection layer and the electron transport layer cannot conduct the common electrode layer and the metal terminal, a film-forming area of the electron injection layer and the electron transport layer needs to be smaller than a film-forming area of the common electrode layer, and a boundary 413 of the electron injection layer and/or the electron transport layer is located under a boundary 411 of the common electrode layer. A boundary 415 of a first mask is different from a boundary 412 of a second mask, so that the electron injection layer and the electron transport layer can be close to a boundary 416 of the display area without covering the overlapping area 414. Therefore, the current OLED display panels need to use different masks to form the common electrode layer and the electron injection layer/the electron transport layer.

As shown in FIG. 5(b), the present disclosure uses one mask to form the electron injection layer, the electron transport layer, and the common electrode layer. When a boundary 424 of the display area and the overlapping area 152 are not changed, there is only one boundary 423 of the mask. The boundary 422 of the electron injection layer and/or the electron transport layer basically overlaps or even overlaps with the boundary 421 of the common electrode layer, and the common electrode layer and the metal terminal can be conducted to each other by the above embodiments. Therefore, the electron injection layer, the electron transport layer, and the common electrode layer can be formed by the same mask, thereby improving the manufacturing efficiency of the OLED display panel and reducing the cost.

In an embodiment, as shown in FIG. 1, the driving circuit layer 12 includes an active layer 121, a first gate insulating layer 122, a first metal layer 123, a second gate insulating layer 124, a second metal layer 125, an interlayer insulating layer 126, a source and drain electrode layer 127, and a planarization layer 128.

In an embodiment, as shown in FIG. 1, the source and drain electrode layer 127 includes a source electrode 127a and a drain electrode.

In an embodiment, as shown in FIG. 1, the light-emitting functional layer 13 includes a pixel electrode layer 131, a light-emitting material layer 132, and a pixel definition layer 133.

In an embodiment, as shown in FIG. 1, the light-emitting material layer 132 includes a hole injection layer 132a, a hole transport layer 132b, and a light-emitting layer 132c.

In an embodiment, the metal terminal is formed using the source and drain electrode layer, such as the metal terminal shown in FIG. 2, but the embodiments of the present disclosure are not limited to this. As shown in FIG. 6(b), the OLED display panel further includes a passivation layer 511 and a connecting metal layer, and the connecting metal layer forms the metal terminal 127b.

Figure 6:
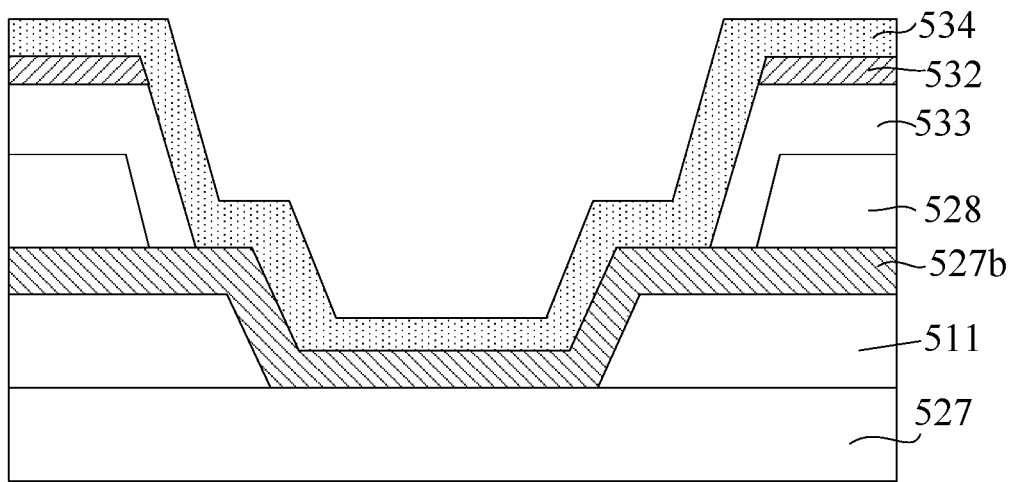
FIG. 6 is a schematic comparison diagram of a design of an overlapping area of the OLED display panel and a design of an overlapping area of the existing OLED display panel according to an embodiment of the present disclosure.
Figure 6:
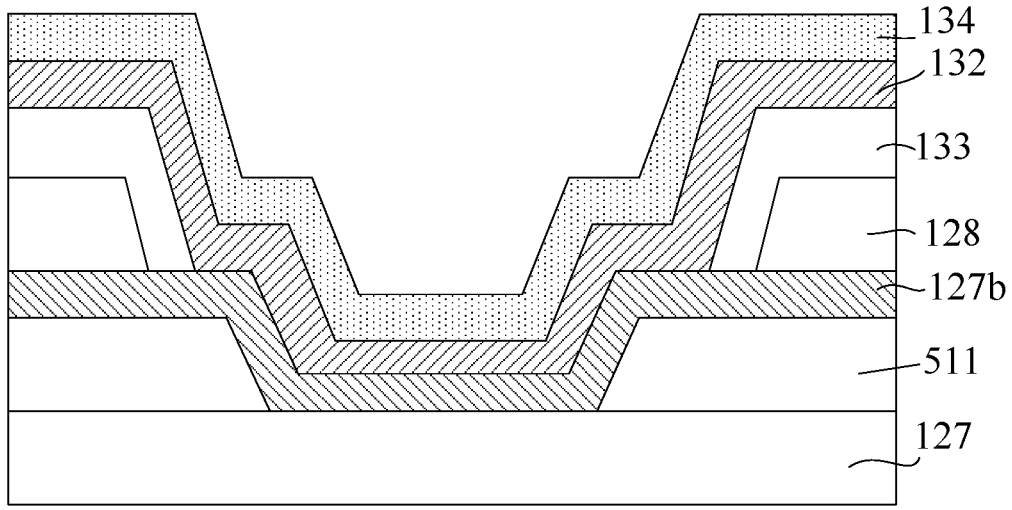

As shown in FIG. 6, FIG. 6(a) is a schematic diagram of the overlapping area of current display devices, and FIG. 6(b) is a schematic diagram of the overlapping area of the OLED display panel in the present disclosure. Current display devices include the source and drain electrode layer 527, the passivation layer 511, the metal wiring 527b, the planarization layer 528, the pixel definition layer 533, the electron transport layer 532, and the common electrode layer 534. However, since in the overlapping area, the common electrode layer and the metal wiring need to be directly connected, different masks are required for forming the electronic layer and the common electrode layer. In the overlapping area of the present disclosure, the common electrode layer and the metal wiring are conducted to each other by the electronic layer, so one metal mask can be used to form the electronic layer and the common electrode layer, thereby improving the manufacturing efficiency of the OLED display panel and reducing the cost, and meanwhile, the common electrode layer and the metal terminal can be normally connected and conducted to each other, allowing the OLED display panel to work normally.

Figure 7:
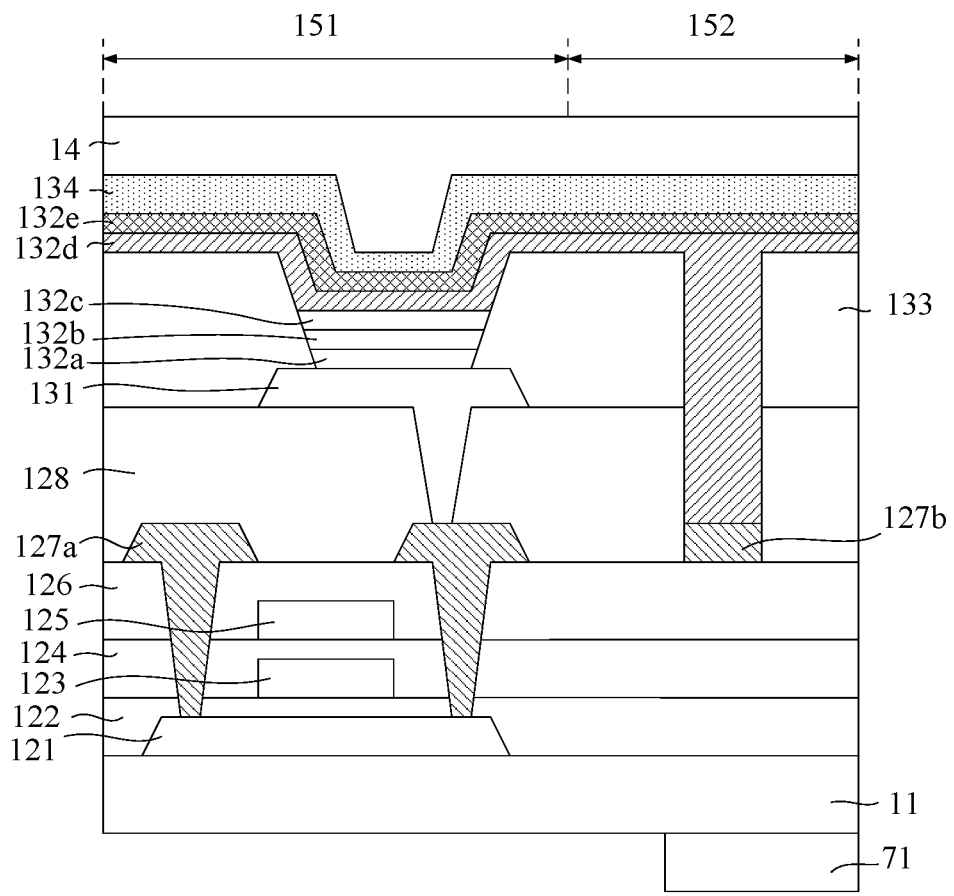
FIG. 7 is a schematic diagram of an OLED display device according to an embodiment of the present disclosure.

Further, as shown in FIG. 7, an embodiment of the present disclosure provides an OLED display device, which includes an OLED display panel and a driving chip 71. Wherein, the OLED display panel includes:
 a substrate 11;
 a driving circuit layer 12 disposed on one side of the substrate 11 and including a metal terminal 127b;
 a light-emitting functional layer 13 disposed on one side of the driving circuit layer 12 away from the substrate 11 and including an electronic layer 132f and a common electrode layer 134; and
 an encapsulation layer 14 disposed on one side of the light-emitting functional layer 13 away from the driving circuit layer 12.

Wherein, the OLED display panel 1 includes a display area 151 and an overlapping area 152, and in the overlapping area 152, the electronic layer 132f is disposed between the common electrode layer 134 and the metal terminal 127b. A thickness of the electronic layer 132f is less than a first default value, and/or a material mobility of at least one of the electronic layer 132f or the common electrode layer 134 is greater than a second default value. The first default value is a thickness that a particle tunneling effect occurs, and the second default value is a particle mobility when the common electrode layer 134 and the metal terminal 127b are connected and conducted to each other.

In an embodiment, in the display device, the thickness of the electronic layer is less than 10 nm.

In an embodiment, in the display device, a material of the common electrode layer includes a metal material, and a mobility of the metal material is greater than the second default value.

In an embodiment, the common electrode layer is a single metal layer.

In an embodiment, the common electrode layer includes a plurality of film layers disposed in a stack, a material of at least one of the film layers includes the metal material, and a mobility of the metal material is greater than the second default value.

In an embodiment, in the display device, the common electrode layer includes a plurality of film layers disposed in a stack, a material of at least one of the film layers includes the metal material, and a mobility of the metal material is greater than the second default value.

In an embodiment, in the display device, the electronic layer includes an electron injection layer and an electron transport layer, the electron injection layer is disposed between the electron transport layer and the common electrode layer, and a material mobility of at least one of the electron injection layer or the electron transport layer is greater than the second default value.

In an embodiment, in the display device, a material of the electron injection layer 132e includes an organic material, a material of the electron transport layer 132d includes another organic material, at least one of the electron injection layer 132e or the electron transport layer 132d is doped with a first conductive material, and a mobility of the first conductive material is greater than the second default value.

In an embodiment, in the display device, the material of the electron injection layer includes a second conductive material, the material of the electron transport layer includes the organic material, and a mobility of the second conductive material is greater than the second default value.

In an embodiment, in the display device, the electron transport layer is doped with a third conductive material, and a sum of a mobility of the third conductive material and the mobility of the second conductive material is greater than the second default value.

In an embodiment, in the display device, the material of the electron injection layer includes the second conductive material, the material of the electron transport layer includes the organic material, the electron transport layer is doped with the third conductive material, the mobility of the second conductive material is less than or equal to the second default value, and the sum of the mobility of the second conductive material and the mobility of the third conductive material is greater than the second default value.

It can be known according to the above embodiments:

the embodiments of the present disclosure provide the OLED display panel and the OLED display device. The OLED display panel includes the substrate, the driving circuit layer, the light-emitting functional layer, and the encapsulation layer. The driving circuit layer is disposed on one side of the substrate and includes the metal terminal. The light-emitting functional layer is disposed on one side of the driving circuit layer away from the substrate and includes the electronic layer and the common electrode layer. The encapsulation layer is disposed on one side of the light-emitting functional layer away from the driving circuit layer. Wherein, the OLED display panel includes the display area and the overlapping area, and in the overlapping area, the electronic layer is disposed between the common electrode layer and the metal terminal. The thickness of the electronic layer is less than the first default value, and/or the material mobility of at least one of the electronic layer or the common electrode layer is greater than the second default value, the first default value is the thickness that the particle tunneling effect occurs, and the second default value is the particle mobility when the common electrode layer and the metal terminal are conducted. In the present disclosure, by allowing the thickness of the electronic layer to be less than the first default value and/or the material mobility of at least one of the electronic layer or the common electrode layer to be greater than the second default value, when the current is input, the metal terminal and the common electrode layer are connected and conducted to each other by the particle tunneling effect, or by particle migration when speeding up the particle migration during panels are tested. Therefore, the electronic layer and the common electrode layer may be formed by one metal mask, so the manufacturing efficiency of the OLED display panel can be improved, and the cost can be reduced, and meanwhile, the common electrode layer and the metal terminal can be normally connected and conducted to each other, allowing the OLED display panel to work normally.

In the above embodiments, the description of each embodiment has its own emphasis. For the parts that are not described in detail in an embodiment, can refer to the detailed description of other embodiments above.

The OLED display panel and the OLED display device provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. An organic light-emitting diode (OLED) display panel, comprising:
    a substrate;
    a driving circuit layer disposed on one side of the substrate and comprising an active layer, a first gate insulating layer, a first metal layer, a second gate insulating layer, a second metal layer, an interlayer insulating layer, a source and drain electrode layer, a planarization layer, and a metal terminal;
    a light-emitting functional layer disposed on one side of the driving circuit layer away from the substrate and comprising a pixel electrode layer, a pixel definition layer, an electronic layer and a common electrode layer, the electronic layer comprising an electron injection layer and an electron transport layer; and
    an encapsulation layer disposed on one side of the light-emitting functional layer away from the driving circuit layer;
    wherein the OLED display panel comprises a display area and an overlapping area, and in the overlapping area, the electronic layer is disposed between the common electrode layer and the metal terminal;
    a thickness of the electronic layer is less than a first default value, or a material mobility of at least one of the electronic layer or the common electrode layer is greater than a second default value, the first default value is a thickness that a particle tunneling effect occurs, and the second default value is a particle mobility when the common electrode layer and the metal terminal are conducted; and
    wherein in the overlapping area, a first via penetrates through the planarization layer, a second via penetrates through the pixel definition layer, the metal terminal is disposed in the first via and is in a same layer with the source and drain electrode layer, the electron transport layer is disposed in the second via and the first via and is in contact with the metal terminal in the first via, and the first via and the second via have a same width in a horizontal direction.

2. The OLED display panel according to claim 1, wherein the thickness of the electronic layer is less than 10 nm.

3. The OLED display panel according to claim 1, wherein a material of the common electrode layer comprises a metal material, and a mobility of the metal material is greater than the second default value.

4. The OLED display panel according to claim 1, wherein the common electrode layer comprises a plurality of film layers disposed in a stack, a material of at least one of the film layers comprises a metal material, and a mobility of the metal material is greater than the second default value.

5. The OLED display panel according to claim 1, wherein the electron injection layer is disposed between the electron transport layer and the common electrode layer, and a material mobility of at least one of the electron injection layer or the electron transport layer is greater than the second default value.

6. The OLED display panel according to claim 5, wherein a material of the electron injection layer comprises an organic material, a material of the electron transport layer comprises another organic material, at least one of the electron injection layer or the electron transport layer is doped with a first conductive material, and a mobility of the first conductive material is greater than the second default value.

7. The OLED display panel according to claim 5, wherein a material of the electron injection layer comprises a first conductive material, a material of the electron transport layer comprises an organic material, and a mobility of the first conductive material is greater than the second default value.

8. The OLED display panel according to claim 7, wherein the electron transport layer is doped with a second conductive material, and a sum of a mobility of the second conductive material and the mobility of the first conductive material is greater than the second default value.

9. The OLED display panel according to claim 5, wherein a material of the electron injection layer comprises a first conductive material, a material of the electron transport layer comprises an organic material, the electron transport layer is doped with a second conductive material, a mobility of the first conductive material is less than or equal to the second default value, and a sum of a mobility of the first conductive material and a mobility of the second conductive material is greater than the second default value.

10. An organic light-emitting diode (OLED) display device, comprising an OLED display panel and a driving chip, wherein the OLED display panel comprises:
   a substrate;
   a driving circuit layer disposed on one side of the substrate and comprising an active layer, a first gate insulating layer, a first metal layer, a second gate insulating layer, a second metal layer, an interlayer insulating layer, a source and drain electrode layer, a planarization layer, and a metal terminal;
   a light-emitting functional layer disposed on one side of the driving circuit layer away from the substrate and comprising a pixel electrode layer, a pixel definition layer, an electronic layer and a common electrode layer, the electronic layer comprising an electron injection layer and an electron transport layer; and
   an encapsulation layer disposed on one side of the light-emitting functional layer away from the driving circuit layer;
   wherein the OLED display panel comprises a display area and an overlapping area, and in the overlapping area, the electronic layer is disposed between the common electrode layer and the metal terminal;
   a thickness of the electronic layer is less than a first default value, or a material mobility of at least one of the electronic layer or the common electrode layer is greater than a second default value, the first default value is a thickness that a particle tunneling effect occurs, and the second default value is a particle mobility when the common electrode layer and the metal terminal are conducted; and
   wherein in the overlapping area, a first via penetrates through the planarization layer, a second via penetrates through the pixel definition layer, the metal terminal is disposed in the first via and is in a same layer with the source and drain electrode layer, the electron transport layer is disposed in the second via and the first via and is in contact with the metal terminal in the first via, and the first via and the second via have a same width in a horizontal direction.

11. The OLED display device according to claim 10, wherein the thickness of the electronic layer is less than 10 nm.

12. The OLED display device according to claim 10, wherein a material of the common electrode layer comprises a metal material, and a mobility of the metal material is greater than the second default value.

13. The OLED display device according to claim 10, wherein the common electrode layer is a single metal layer.

14. The OLED display device according to claim 10, wherein the common electrode layer comprises a plurality of film layers disposed in a stack, a material of at least one of the film layers comprises a metal material, and a mobility of the metal material is greater than the second default value.

15. The OLED display device according to claim 10, wherein the electron injection layer is disposed between the electron transport layer and the common electrode layer, and a material mobility of at least one of the electron injection layer or the electron transport layer is greater than the second default value.

16. The OLED display device according to claim 15, wherein a material of the electron injection layer comprises an organic material, a material of the electron transport layer comprises another organic material, at least one of the electron injection layer or the electron transport layer is doped with a first conductive material, and a mobility of the first conductive material is greater than the second default value.

17. The OLED display device according to claim 15, wherein a material of the electron injection layer comprises a first conductive material, a material of the electron transport layer comprises an organic material, and a mobility of the first conductive material is greater than the second default value.

18. The OLED display device according to claim 17, wherein the electron transport layer is doped with a second conductive material, and a sum of a mobility of the second conductive material and the mobility of the first conductive material is greater than the second default value.

19. The OLED display device according to claim 15, wherein a material of the electron injection layer comprises a first conductive material, a material of the electron transport layer comprises an organic material, the electron transport layer is doped with a second conductive material, a mobility of the first conductive material is less than or equal to the second default value, and a sum of a mobility of the first conductive material and a mobility of the second conductive material is greater than the second default value.

* * * * *